United States Patent
Chang et al.

(10) Patent No.: US 9,978,692 B2
(45) Date of Patent: May 22, 2018

(54) INTEGRATED CIRCUIT, ELECTRONIC DEVICE AND METHOD FOR TRANSMITTING DATA IN ELECTRONIC DEVICE

(71) Applicant: MediaTek Inc., Hsin-Chu (TW)

(72) Inventors: PoHao Chang, New Taipei (TW); Chun-Wei Chang, Taipei (TW); Ching-Chih Li, New Taipei (TW)

(73) Assignee: MediaTek Inc., Hsin-Chu (TW)

( * ) Notice: Subject to any disclaimer, the term of this patent is extended or adjusted under 35 U.S.C. 154(b) by 187 days.

(21) Appl. No.: 14/997,048

(22) Filed: Jan. 15, 2016

(65) Prior Publication Data

US 2016/0233174 A1     Aug. 11, 2016

Related U.S. Application Data

(60) Provisional application No. 62/114,266, filed on Feb. 10, 2015.

(51) Int. Cl.
| | |
|---|---|
| *H05K 1/02* | (2006.01) |
| *H01L 23/552* | (2006.01) |
| *H01L 23/66* | (2006.01) |
| *H01L 23/528* | (2006.01) |
| *H01L 27/12* | (2006.01) |

(Continued)

(52) U.S. Cl.
CPC ...... *H01L 23/552* (2013.01); *H01L 23/49838* (2013.01); *H01L 23/5286* (2013.01); *H01L 23/66* (2013.01); *H01L 27/12* (2013.01); *H04B 3/32* (2013.01); *H05K 1/0218* (2013.01); *H01L 24/16* (2013.01); *H01L 25/0655* (2013.01); *H01L 2223/6688* (2013.01); *H01L 2224/16227* (2013.01); *H01L 2924/14* (2013.01); *H01L 2924/15192* (2013.01); *H01L 2924/3025* (2013.01); *H05K 1/0216* (2013.01); *H05K 1/0219* (2013.01); *H05K 1/0243* (2013.01); *H05K 3/46* (2013.01)

(58) Field of Classification Search
None
See application file for complete search history.

(56) References Cited

U.S. PATENT DOCUMENTS 5,838,412 A * 11/1998 Ueda ............... G02B 6/0088
349/150
9,299,508 B2    3/2016 Ding et al.
(Continued)

FOREIGN PATENT DOCUMENTS

| CN | 103513818 A | 1/2014 |
|---|---|---|
| TW | 200539525 A | 12/2005 |
| TW | 201437877 A | 10/2014 |

*Primary Examiner* — Courtney Smith
*Assistant Examiner* — Jessey R Ervin
(74) *Attorney, Agent, or Firm* — Wolf, Greenfield & Sacks, P.C.

(57) ABSTRACT

An integrated circuit is provided. The integrated circuit includes a control circuitry, a plurality of pins, and a plurality of driving units coupled to the pins. The control circuitry provides a plurality of control signals according to data to be transmitted. The pins are coupled to a device via a plurality of conductive traces of a printed circuit board (PCB). The control signals control each of the driving units to selectively provide the data or one specific shielding pattern via the corresponding pin and the corresponding conductive trace of PCB to the device.

26 Claims, 11 Drawing Sheets

(51) Int. Cl.
    *H04B 3/32*          (2006.01)
    *H01L 23/498*      (2006.01)
    H05K 3/46          (2006.01)
    H01L 23/00        (2006.01)
    H01L 25/065      (2006.01)

(56) References Cited

U.S. PATENT DOCUMENTS

| | | | |
|---|---|---|---|
| 9,330,218 B1* | 5/2016 | Chiu | G11C 29/022 |
| 2004/0174807 A1* | 9/2004 | Li | H04B 3/34 |
| | | | 370/201 |
| 2005/0221677 A1 | 10/2005 | Hammond, Jr. et al. | |
| 2008/0304352 A1* | 12/2008 | Chen | G06F 13/1694 |
| | | | 365/230.02 |
| 2010/0233908 A1* | 9/2010 | Tseng | H01R 27/00 |
| | | | 439/620.21 |
| 2012/0269522 A1* | 10/2012 | Kagaya | H01P 3/026 |
| | | | 398/183 |
| 2013/0128646 A1* | 5/2013 | Nishihara | H01L 23/367 |
| | | | 363/141 |
| 2013/0220690 A1 | 8/2013 | Chang et al. | |

* cited by examiner

INTEGRATED CIRCUIT, ELECTRONIC DEVICE AND METHOD FOR TRANSMITTING DATA IN ELECTRONIC DEVICE

CROSS REFERENCE TO RELATED APPLICATIONS

This application claims priority of U.S. Provisional Application No. 62/114,266, filed on Feb. 10, 2015, the entirety of which is incorporated by reference herein.

BACKGROUND OF THE INVENTION

Field of the Invention

The invention relates to an electronic device, and more particularly to guard traces of a printed circuit board (PCB) in an electronic device arranged by a chip on the PCB.

Description of the Related Art

In electronic devices, printed circuit boards (PCBs) are used to mechanically support and electrically connect electronic components using conductive pathways, conductive traces (e.g. signal traces or ground traces) etched from metal sheets laminated onto a non-conductive core substrate. In recent years, an increased amount of input/output (I/O) connections for multi-functional or memory chips is required for a semiconductor chip package design. The impact of this will be pressure on printed circuit board (PCB) fabricators to minimize the width and the space of the conductive traces, or increase the number of layers on the PCB. The conductive traces used to transmit the signals corresponding to the same function need to be arranged and configured in the same manner on the PCB. For example, the conductive traces used to transmit the address/data bus of a memory need to be arranged and configured in parallel, and the spaces between the conductive traces are also small. However, the adjacent conductive traces on the PCB can result in a crosstalk problem, especially in high signal speed applications. Thus, the crosstalk problem can detrimentally affect the quality of a signal traveling on a conductive trace, thereby affecting the signal reception of the electronic component supported by the PCB.

Therefore, it is desirable to optimize the arrangement of the conductive traces for avoiding the crosstalk problem on a PCB of an electronic device.

BRIEF SUMMARY OF THE INVENTION

An integrated circuit, an electronic device, and a method for transmitting data from a first chip to a second chip via a plurality of conductive traces of a printed circuit board (PCB) in an electronic device are provided. An embodiment of an integrated circuit is provided. The integrated circuit comprises a control circuitry, a plurality of pins, and a plurality of driving units coupled to the pins. The control circuitry provides a plurality of control signals according to data to be transmitted. The pins are coupled to a device via a plurality of conductive traces of a printed circuit board (PCB). The control signals control each of the driving units to selectively provide the data or one specific shielding pattern via the corresponding pin and the corresponding conductive trace of PCB to the device.

Furthermore, an embodiment of an electronic device is provided. The electronic device comprises a printed circuit board (PCB), a first chip mounted on the PCB, and a second chip mounted on the PCB. The PCB comprises a plurality of conductive traces. The first chip comprises a plurality of pins coupled to the second chip via the conductive traces of the PCB, a control circuitry, and a plurality of driving units coupled to the pins. The control circuitry provides a plurality of control signals according to data to be transmitted to the second chip. The driving units output the data to the conductive traces of the PCB via the pins according to the control signals. In a normal mode, the control signals control the driving units to provide the data to the second chip via the conductive traces of the PCB according to a first transmission rate. In a high-speed mode, the driving units are divided into a plurality first driving units and a plurality of second driving units according to the control signals, and the conductive trace corresponding to the first driving unit is a signal trace and the conductive trace corresponding to the second driving unit is a guard trace. In the high-speed mode, the data is provided to the second chip via the signal traces according to a second transmission rate that is higher than the first transmission rate, wherein the guard traces are separated by the signal traces on the PCB.

Moreover, an embodiment of method for transmitting data from a first chip to a second chip via a plurality of conductive traces of a printed circuit board (PCB) in an electronic device is provided, wherein the first chip and the second chip are mounted on the PCB. A plurality of control signals are provided according to the data to be transmitted to the second chip, by the first chip. In a normal mode, in respond to the control signals, a plurality of driving units of the first chip are controlled to output the data via the conductive traces of the PCB according to a first transmission rate. In a high-speed mode, the driving units of the first chip are divided into a plurality of first driving units and a plurality of second driving units according to the control signals. The first driving units are controlled to output the data via a plurality of signal traces among the conductive traces of the PCB according to a second transmission rate that is higher than the first transmission rate. The second driving units are controlled to output at least one specific shielding pattern via a plurality of guard traces among the conductive traces of the PCB. Each of the guard traces is surrounded by the signal traces on the PCB.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
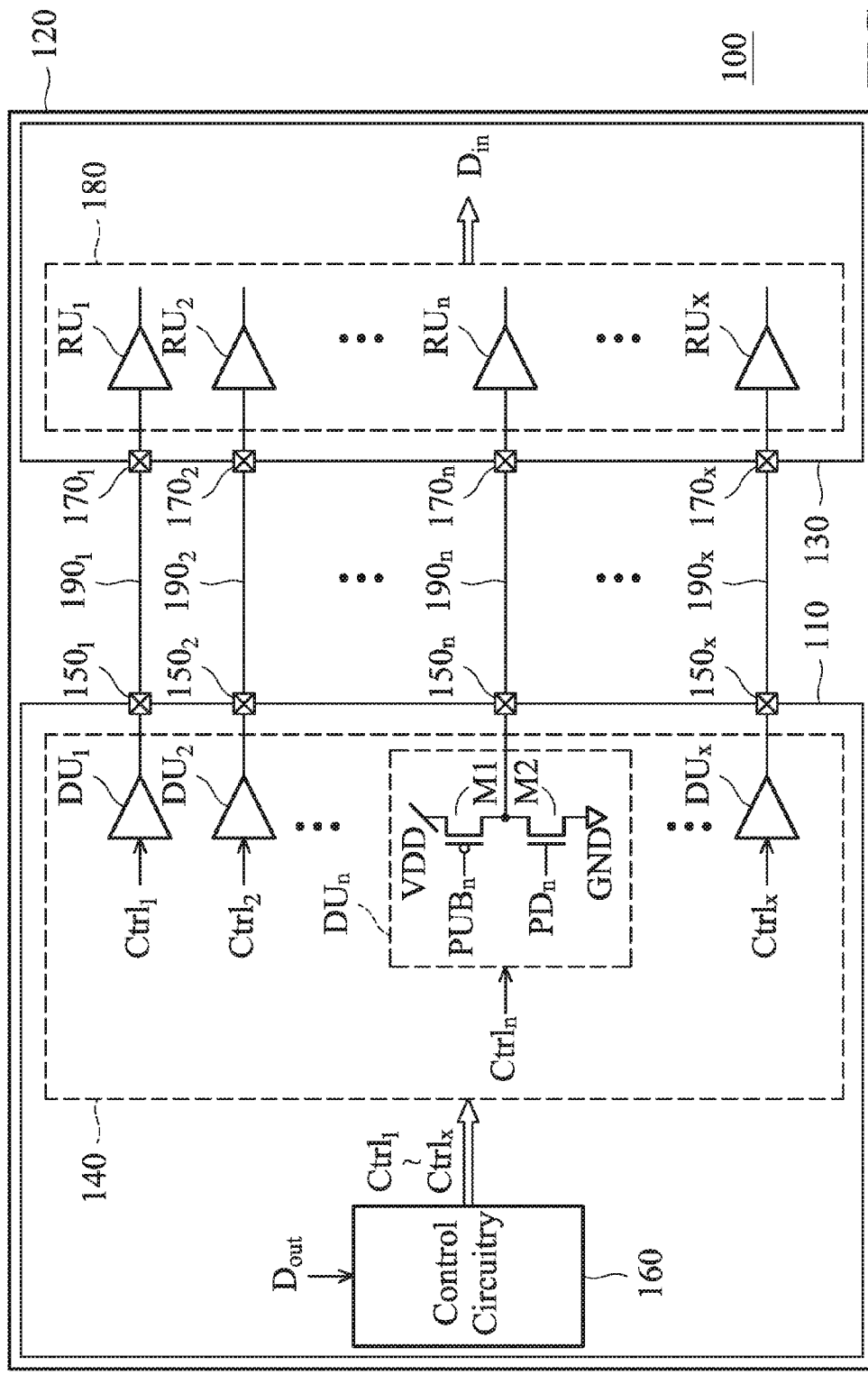
FIG. 1 shows an electronic device according to an embodiment of the invention.

FIG. 1 shows an electronic device 100 according to an embodiment of the invention. The electronic device 100 comprises a first chip 110, a printed circuit board (PCB) 120, and a second chip 130, wherein the first chip 110 and the second chip 130 are mounted on the PCB 120. The first chip 110 can transmit data to the second chip 130 via a plurality of conductive traces $190_1$-$190_x$ of the PCB 120. In the embodiment, the conductive traces $190_1$-$190_x$ are capable of transmitting high-speed signals. The first chip 110 comprises an output module 140, a plurality of pins $150_1$-$150_x$, and a control circuitry 160. The control circuitry receives data $D_{out}$ to be provided to the second chip 130, and provides a plurality of control signals $Ctrl_1$-$Ctrl_x$ to the second chip 130 according to the data $D_{out}$. In one embodiment, the data $D_{out}$ is obtained from a circuit (e.g. a memory, a processor or other functional circuitry) of the first chip 110 or a device outside the first chip 110. The output module 140 comprises a plurality of driving units $DU_1$-$Du_x$, wherein an output of each driving unit is coupled to the corresponding pin of the first chip 110. For example, the output of the driving unit $DU_1$ is coupled to the pin $150_1$ of the first chip 110, and the output of the driving unit $DU_2$ is coupled to the pin $150_2$ of the first chip 110, and so on. In the embodiment, each of the driving units $DU_1$-$DU_x$ has the same circuit and structure. Taking the driving unit $DU_n$ as an example, the driving unit $DU_n$ comprises a PMOS transistor M1 and an NMOS transistor M2. The PMOS transistor M1 is coupled between a power supply VDD and the pin $150_n$, and the PMOS transistor M1 is controlled by a signal $PUB_n$ corresponding to the control signal $Ctrl_n$. The NMOS transistor M2 is coupled between the pin $150_n$ and a ground GND, and the NMOS transistor M2 is controlled by a signal $PD_n$ opposite to the signal $PUB_n$. In the embodiment, according to the control signal $Ctrl_n$, the driving unit $DU_n$ can selectively provide 1-bit data of the data $D_{out}$ to the second chip 130 in a normal mode or a shielding pattern in a high-speed mode via the conductive trace $190_n$ of the PCB 120.

In FIG. 1, the second chip 130 comprises an input module 180 and a plurality of pins $170_1$-$170_x$, wherein the input module 180 comprises a plurality of receiving unit $RU_1$-$RU_x$. Each of the receiving units $RU_1$-$RU_x$ is coupled to the corresponding conductive trace of the PCB 120 via the corresponding pin of the second chip 130, and is used to receive a signal transmitted in the corresponding conductive trace. For example, the receiving unit $RU_1$ is coupled to the conductive trace $190_1$ of the PCB 120 via the pin $170_1$ of the second chip 130, and the receiving unit $RU_2$ is coupled to the conductive trace $190_2$ of the PCB 120 via the pin $170_2$ of the second chip 130. After receiving the signals, the input module 180 is capable of provide an input data $D_{in}$ according to the received signals for subsequent processing. In the embodiment, the first chip 110 is capable of providing the data $D_{out}$ with a first transmission rate R1 in the normal mode and with a second transmission rate R2 in the high-speed mode, wherein the second transmission rate R2 is higher than the first transmission rate R1. In one embodiment, the second transmission rate R2 is twice the first transmission rate R1. Due to the second transmission rate R2 is higher than the first transmission rate R1, the number of transmitted bits per second in the high-speed mode is more than the number of transmitted bits per second in the normal mode, thereby the first chip 110 can use fewer the driving units and the corresponding conductive traces of PCB to transmit the data $D_{out}$. For example, if the first chip 110 is operating in a normal mode, all of the driving units $DU_1$-$DU_x$ are used to provide the data $D_{out}$. If the first chip 110 is operating in a high-speed mode, according to the control signal $Ctrl_1$-$Ctrl_x$, a portion of driving units are selected from the driving units $DU_1$-$DU_x$ to provide the data $D_{out}$, and the remaining driving units (i.e. the unselected driving units) are used to provide at least one specific shielding pattern to form the guard traces GT for the signal traces ST corresponding to the selected driving units. The specific shielding pattern is formed by a ground signal, a power signal or a random signal. For the second chip 130, the shielding pattern is invalid data, thus the second chip 130 will ignore the shielding pattern. The arrangement of the guard traces and the signal traces will be described below.

Figure 2A:
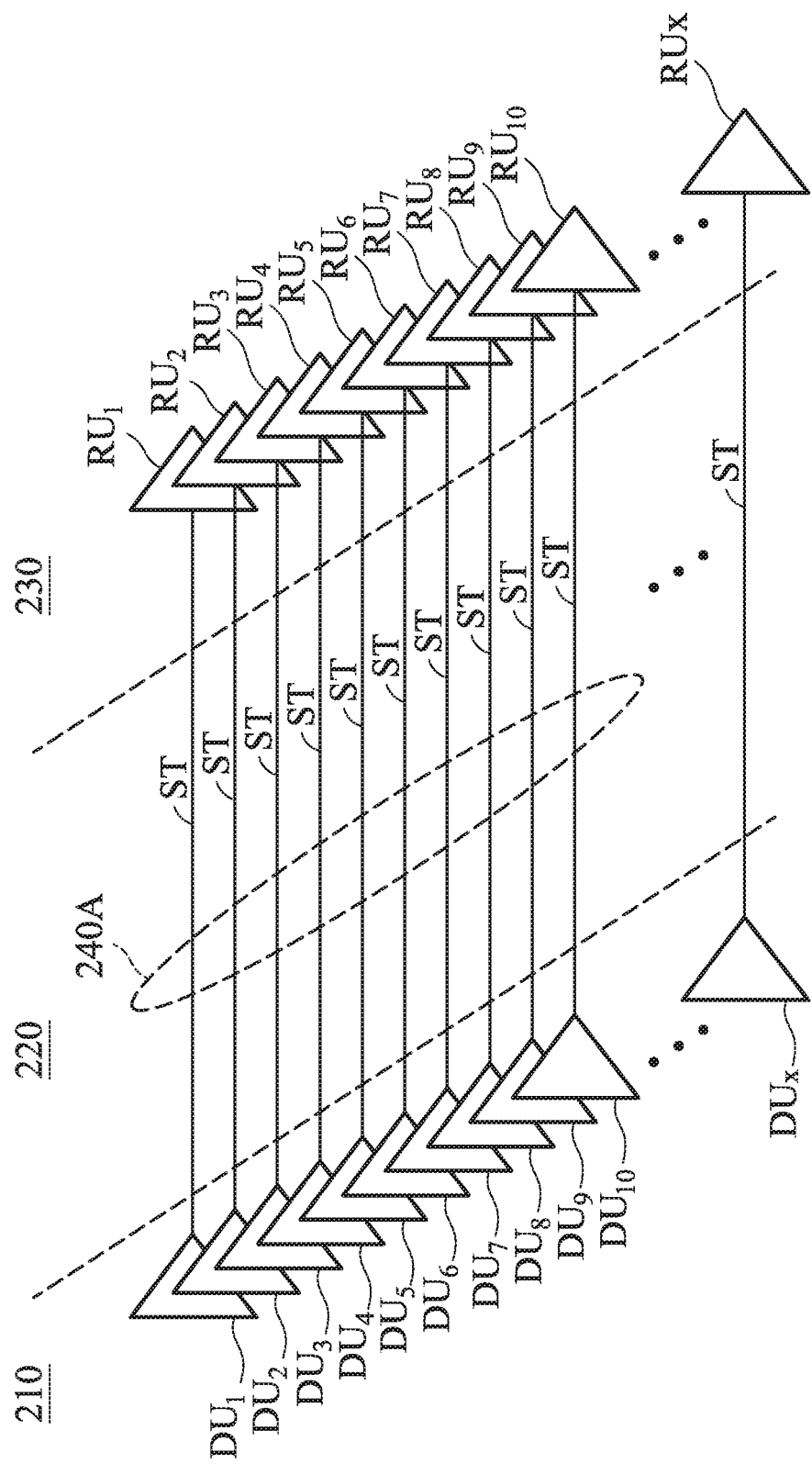
FIG. 2A shows an example illustrating the arrangement of a plurality of conductive traces between a first chip and a second chip on a PCB according to an embodiment of the invention.

FIG. 2A shows an example illustrating the arrangement of a plurality of conductive traces 240A between a first chip 210 and a second chip 230 on a PCB 220 according to an embodiment of the invention. In order to simplify the description, the pins of the first chip 210 and the second chip 230 will be omitted in FIG. 2A. In the embodiment, the first chip 210 is operating in a normal mode, and the conductive traces 240A are disposed on the same layer of the PCB 220, e.g. a top layer of the PCB 220. As described above, all driving units $DU_1$-$DU_x$ of the first chip 210 are used to provide the data $D_{out}$ in the normal mode, thereby all of the conductive traces 240A function as the signal traces ST for transmitting the data $D_{out}$ to the second chip 230.

Figure 2B:
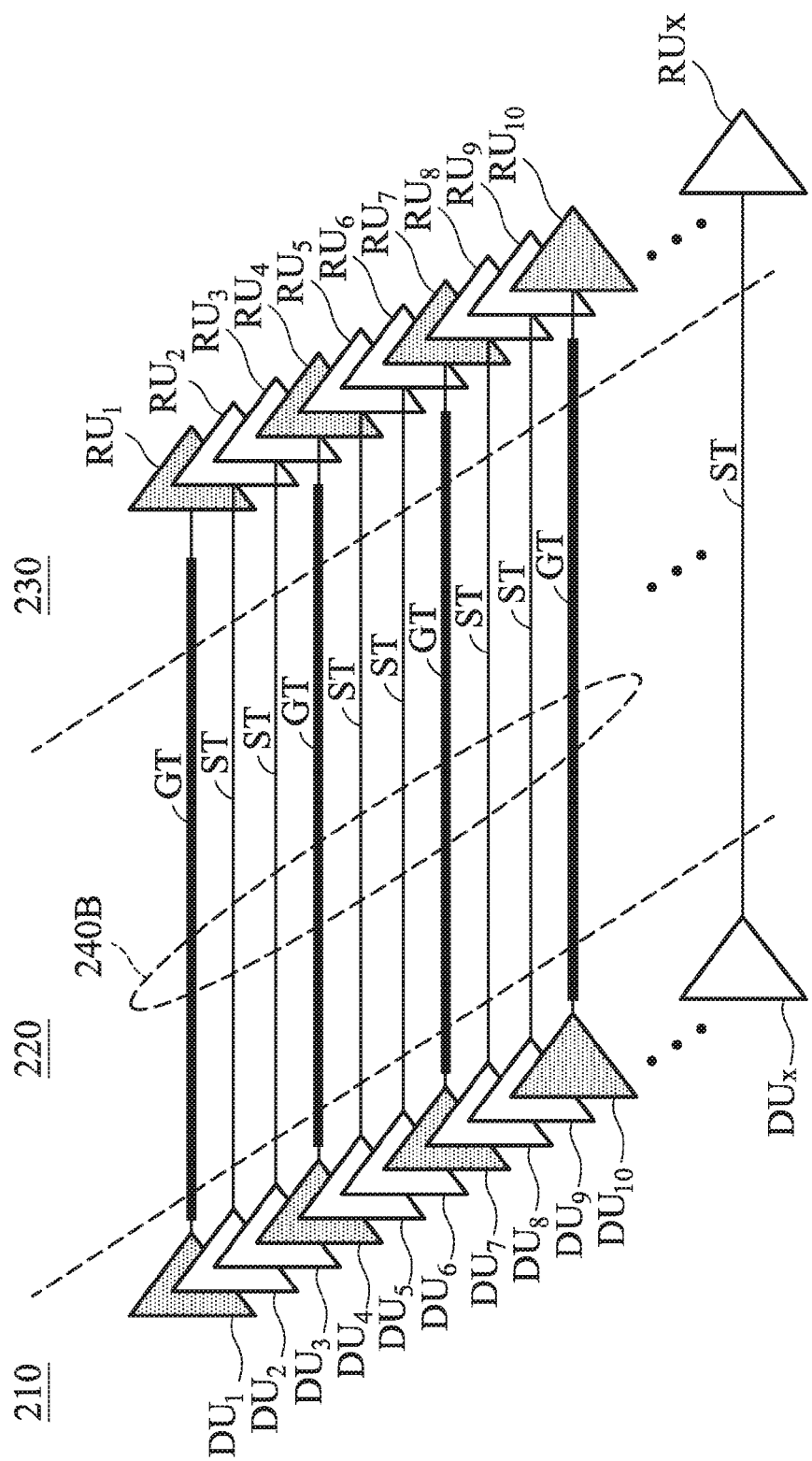
FIG. 2B shows an example illustrating the arrangement of a plurality of conductive traces between the first chip and the second chip on the PCB according to another embodiment of the invention.

FIG. 2B shows an example illustrating the arrangement of a plurality of conductive traces 240B between the first chip 210 and the second chip 230 on the PCB 220 according to another embodiment of the invention. In order to simplify the description, the pins of the first chip 210 and the second chip 230 will be omitted in FIG. 2B. In the embodiment, the first chip 210 is operating in a high-speed mode, and the conductive traces 240B are disposed on the same layer of the PCB 220, e.g. the top layer of the PCB 220. As described above, a portion of driving units are selected from the driving units $DU_1$-$DU_x$ to provide the data $D_{out}$ in the high-speed mode, i.e. not all of the driving units $DU_1$-$DU_x$ are used to provide the data $D_{out}$. Furthermore, the unselected driving units are used to provide at least one shielding pattern. The specific shielding pattern is formed by a ground signal, a power signal or a random signal. For example, the driving units $DU_2$-$DU_3$, $DU_5$-$DU_6$, $DU_8$-$DU_9$ are selected to provide the data $D_{out}$, thereby the conductive traces 240B corresponding to the selected driving units function as the signal traces ST for transmitting the data $D_{out}$ to the second chip 230. Moreover, the unselected driving units $DU_1$, $DU_3$, $DU_7$ and $DU_D$) are used to provide at least one shielding pattern, thereby the conductive traces 240B corresponding to the unselected driving units function as the guard traces GT for reducing crosstalk when the data $D_{out}$ is transmitted via the signal traces ST. It should be noted that the guard traces GT are separated by the signal traces ST in FIG. 2B. Furthermore, the shielding pattern transmitted by each guard trace GT can be the same or different. It should be noted that the number of guard traces GT is less than the number of signal traces ST in FIG. 2B.

Traditionally, after obtaining system specification and requisition, a plurality of shielding lines are implemented on a PCB in order to decrease crosstalk problem, wherein the shielding lines are fixedly routed on the PCB and are also inserted into the conductive traces between the devices on the PCB. In general, the shielding lines are coupled to a ground of the PCB. Compared with the traditional shielding lines, the guard traces GT of FIG. 2B will not occupy the additional area on the PCB 220, i.e. the guard traces GT are the unused signal traces existing on the PCB 220, i.e. the unused signal traces ST will be used as the guard traces GT. Specifically, no additional shielding line is fixedly routed and inserted into the conductive traces 240B on the PCB 220, thus decreasing layout size of the PCB 220. Furthermore, the arrangement of the conductive traces 240B is determined according to the outputs of the driving units $DU_1$-$DU_x$ of the first chip 210, wherein the outputs of the driving units $DU_1$-$DU_x$ are controlled by a control circuitry of the first chip 210, e.g. the control circuitry 160 of FIG. 1, according to the data $D_{out}$. The control circuitry of the first chip 210 can modify the arrangement of the conductive traces 240B via the driving units $DU_1$-$DU_x$ according to actual applications. Furthermore, the guard traces can reduce electrical noise from affecting the signals between the first chip 210 and the second chip 230, e.g. avoiding the signal current loops formed in the conductive traces 240B on the PCB 220. In traditional design flows, a shielding design is passively planned according to system specifications in advance. In the embodiment, the interconnection between the first chip 210 and the second chip 230 can be planned in advance, and the layout of signals of the interconnection can be minimized before the system specifications are confirmed. Next, according to the speed of the system specifications, the shielding pattern is modified, thereby obtaining the best electrical performances. Furthermore, the development cost in the layout is also decreased.

Figure 3:
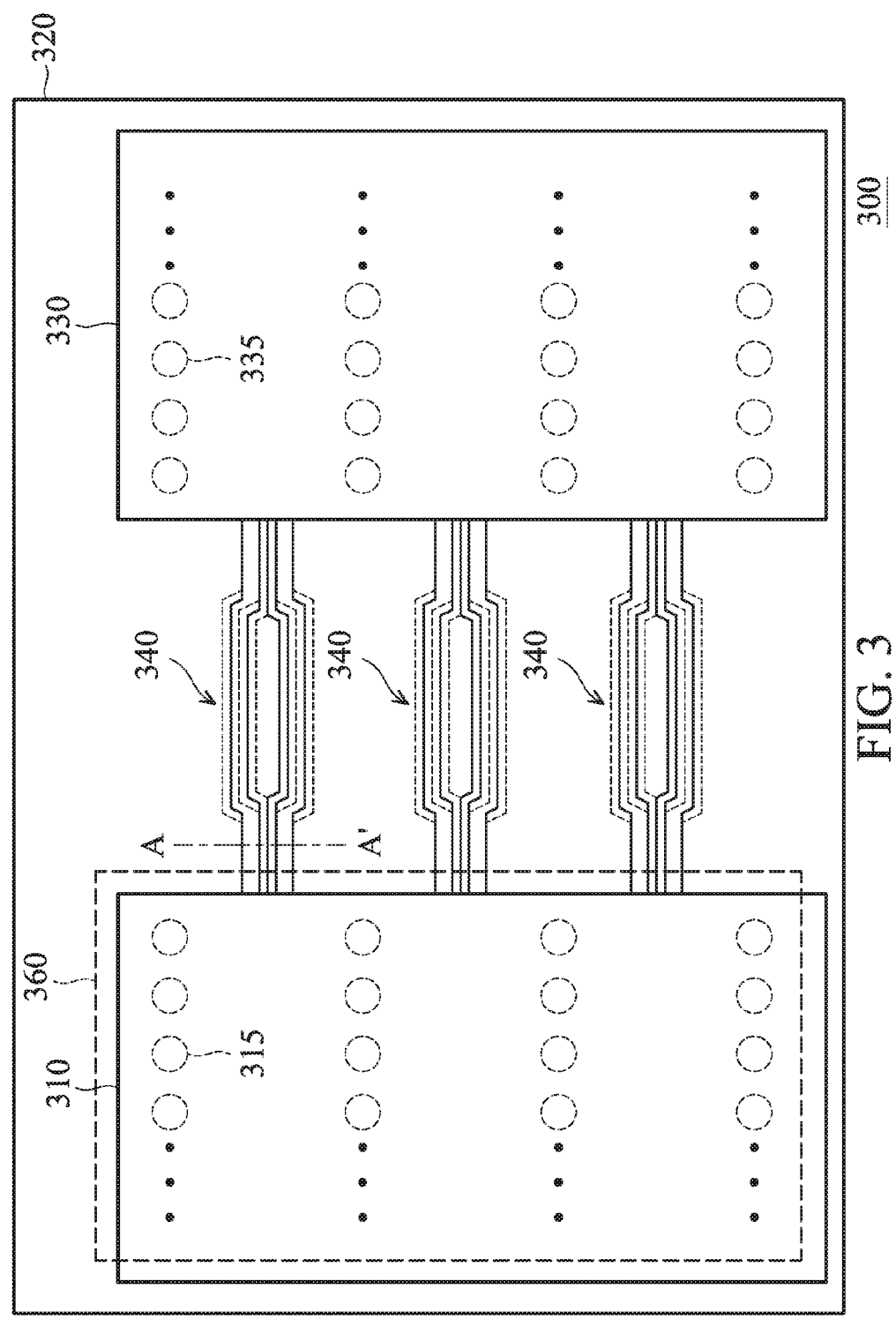
FIG. 3 shows an example illustrating a top view of an electronic device according to another embodiment of the invention.

FIG. 3 shows an example illustrating a top view of an electronic device 300 according to another embodiment of the invention. The electronic device 300 comprises a first chip 310, a PCB 320, a second chip 330, and a plurality of conductive traces 340 between the first chip 310 and the second chip 330. By using a flip chip technology, the first chip 310 is bonded on the PCB 320 via a plurality of bumps 315, and the second chip 330 is bonded on the PCB 320 via a plurality of bumps 335. Furthermore, the first chip 310 comprises a plurality of driving units (e.g. the driving units $DU_1$-$DU_x$ of FIG. 1) for transmitting data $D_{out}$ to the second chip 330, wherein each driving unit is coupled to the individual conductive trace 340 via the corresponding bump 315. As described above, all of the driving units of the first chip 310 are used to provide the data $D_{out}$ with a first transmission rate R1 in a normal mode. Furthermore, a portion of driving units are selected to provide the data $D_{out}$ with a second transmission rate R2 in a high-speed mode, and the remainder of the driving units are used to provide at least one specific shielding pattern in the high-speed mode, wherein the second transmission rate R2 is higher than the first transmission rate R1. In the embodiment, the conductive traces 340 are disposed on different layers of the PCB 320, and coupled between the bumps 315 of the first chip 310 and the bumps 335 of the second chip 330. The example layout range (labeled as 360) of the bumps 315 of the first chip 310 and the conductive traces 340 are described in FIGS. 4A-4C.

Figure 4A:
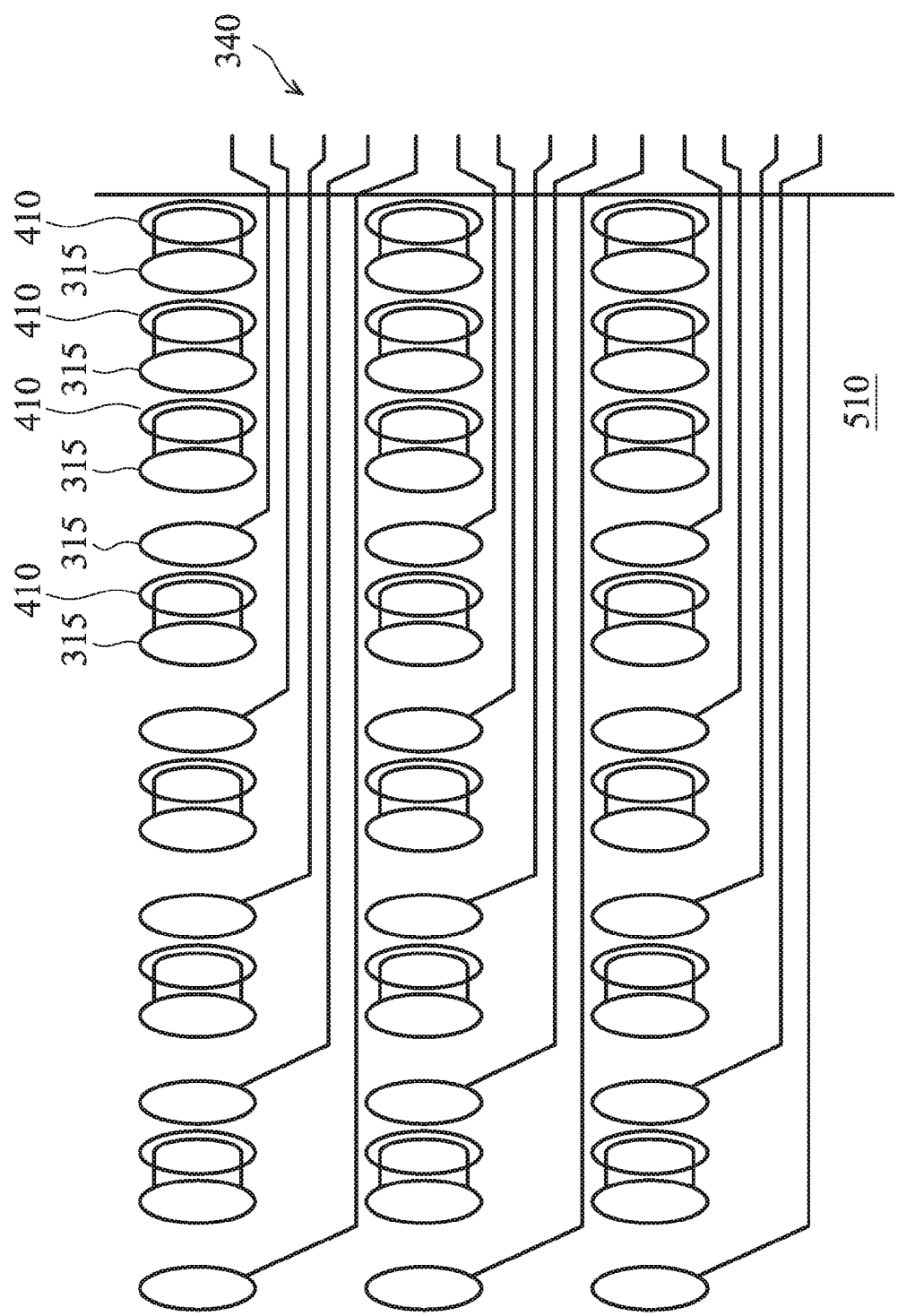
FIG. 4A shows a layout of a first layer on the PCB of FIG. 3.
Figure 4B:
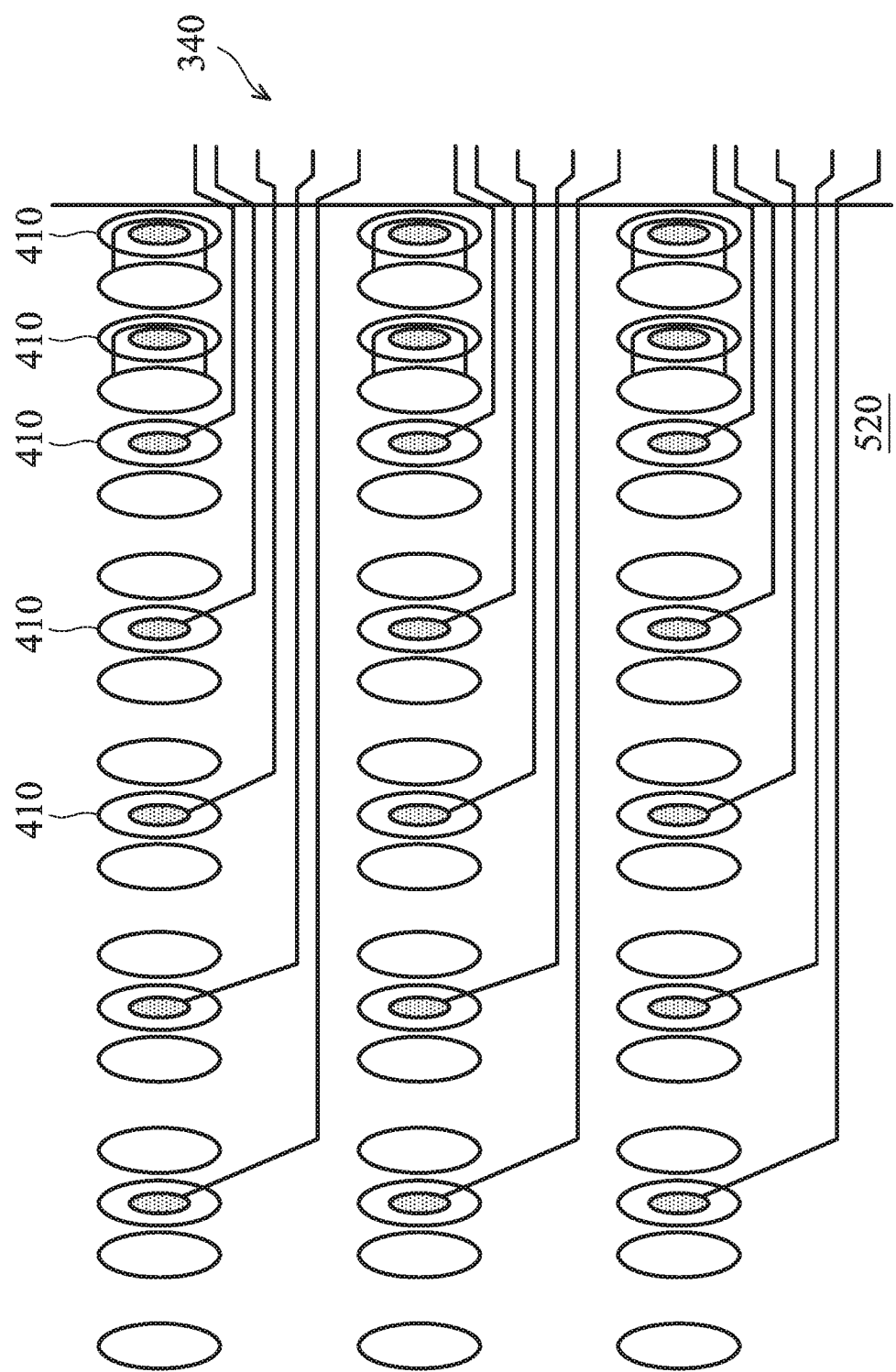
FIG. 4B shows a layout of a second layer below the first layer on the PCB of FIG. 3.
Figure 4C:
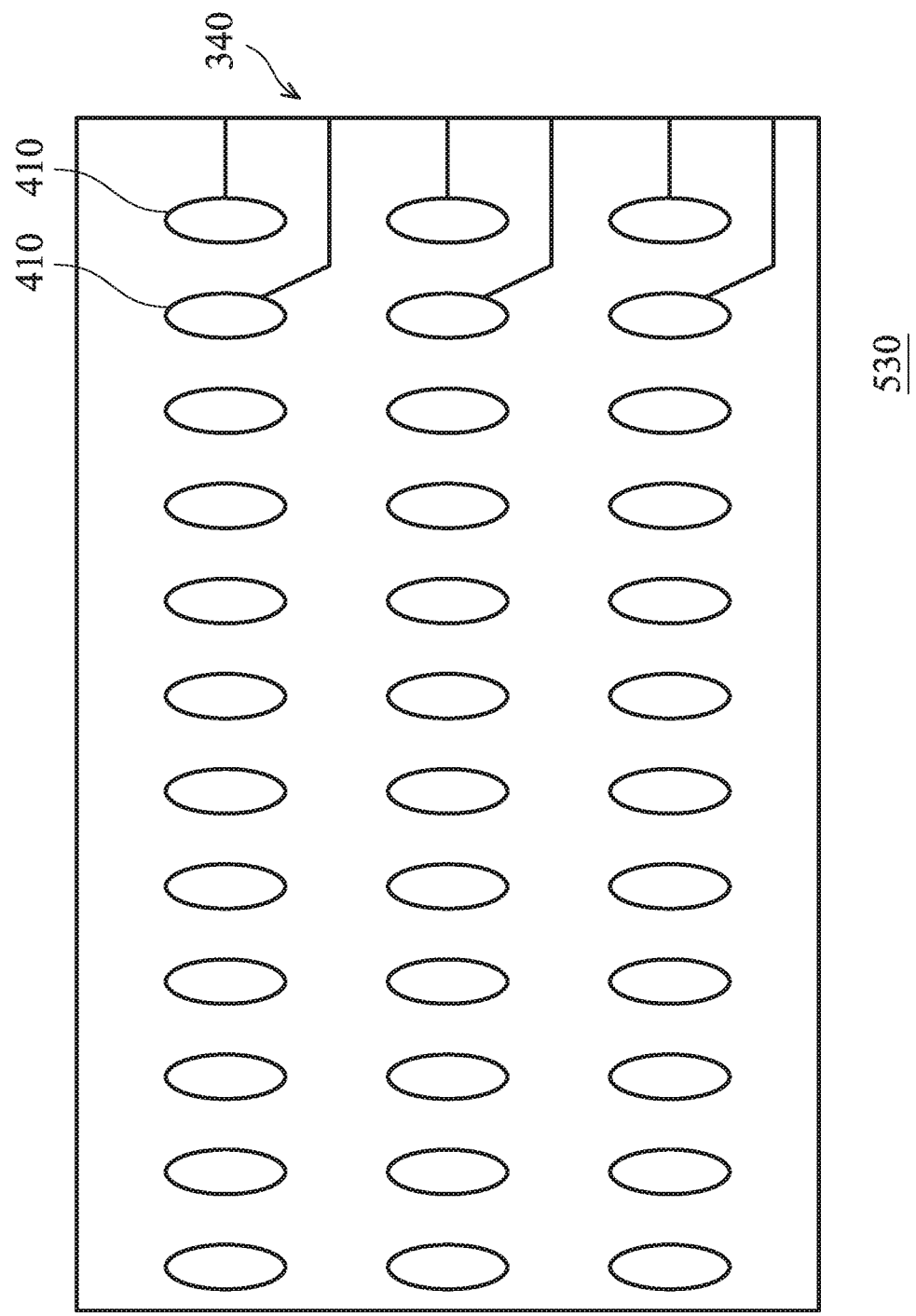
FIG. 4C shows a layout of a third layer below the second layer on the PCB of FIG. 3.

FIG. 4A shows a layout of a first layer 510 (e.g. a top layer) on the PCB 320 of FIG. 3, FIG. 4B shows a layout of a second layer 520 below the first layer 510 on the PCB 320 of FIG. 3, and FIG. 4C shows a layout of a third layer 530 below the second layer 520 on the PCB 320 of FIG. 3. Referring to FIG. 3 and FIGS. 4A-4C together, the conductive traces 340 are coupled to the first chip 310 via the bumps 315 of the first chip 310 and a plurality of vias 410 of the PCB 320.

Figure 5A:
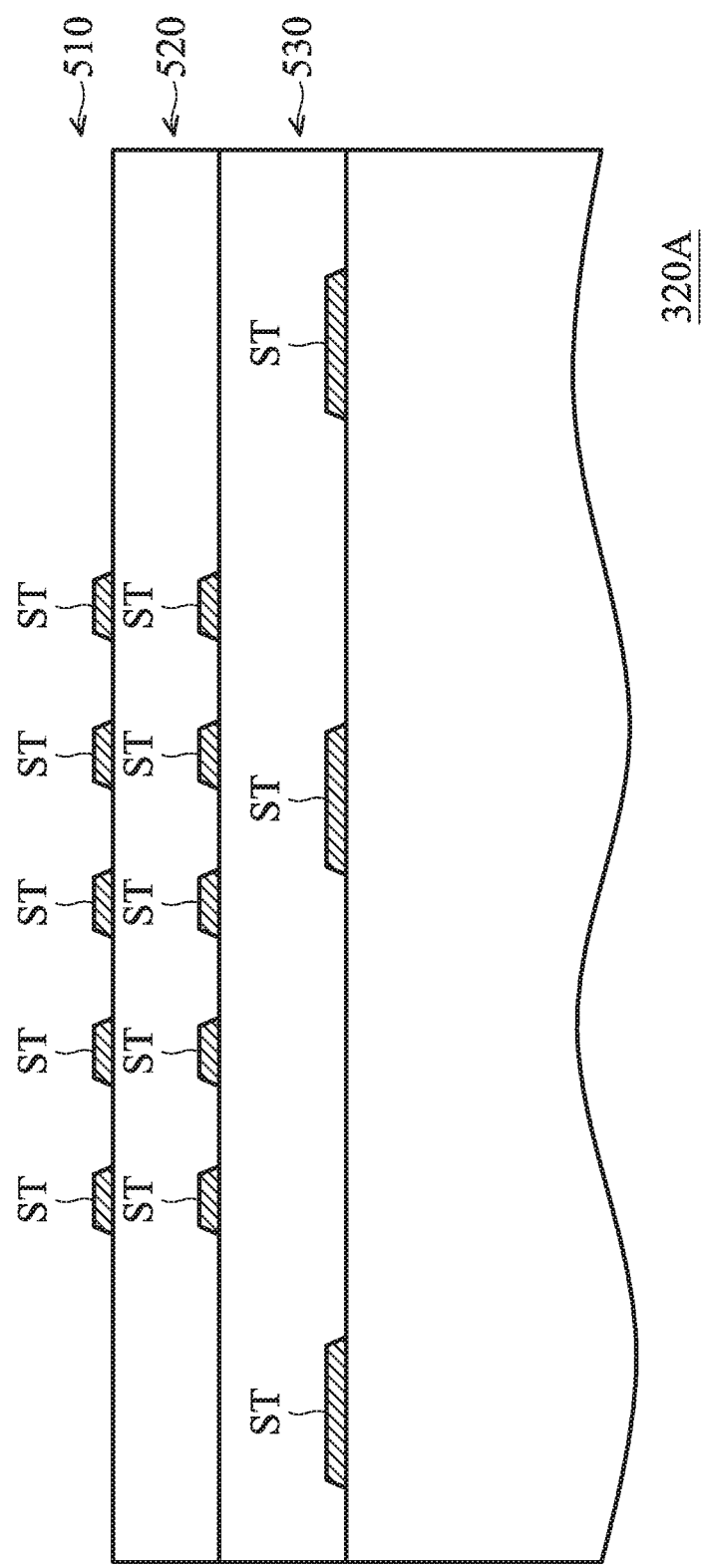
FIG. 5A shows a cross section illustrating the arrangement of the conductive traces of an exemplary PCB along line A-A' of FIG. 3 according to an embodiment of the invention.

FIG. 5A shows a cross section illustrating the arrangement of the conductive traces 340 of an exemplary PCB 320A along line A-A' of FIG. 3 according to an embodiment of the invention. Referring to FIG. 3 and FIG. 5A together, in the embodiment, the first chip 310 is operating in a normal mode. As described above, all driving units of the first chip 310 are used to provide the data $D_{out}$ in the normal mode, thereby all of the conductive traces 340 disposed on the first layer 510, the second layer 520 and the third layer 530 of the PCB 320A function as the signal traces ST for transmitting the data $D_{out}$ to the second chip 330.

Figure 5B:
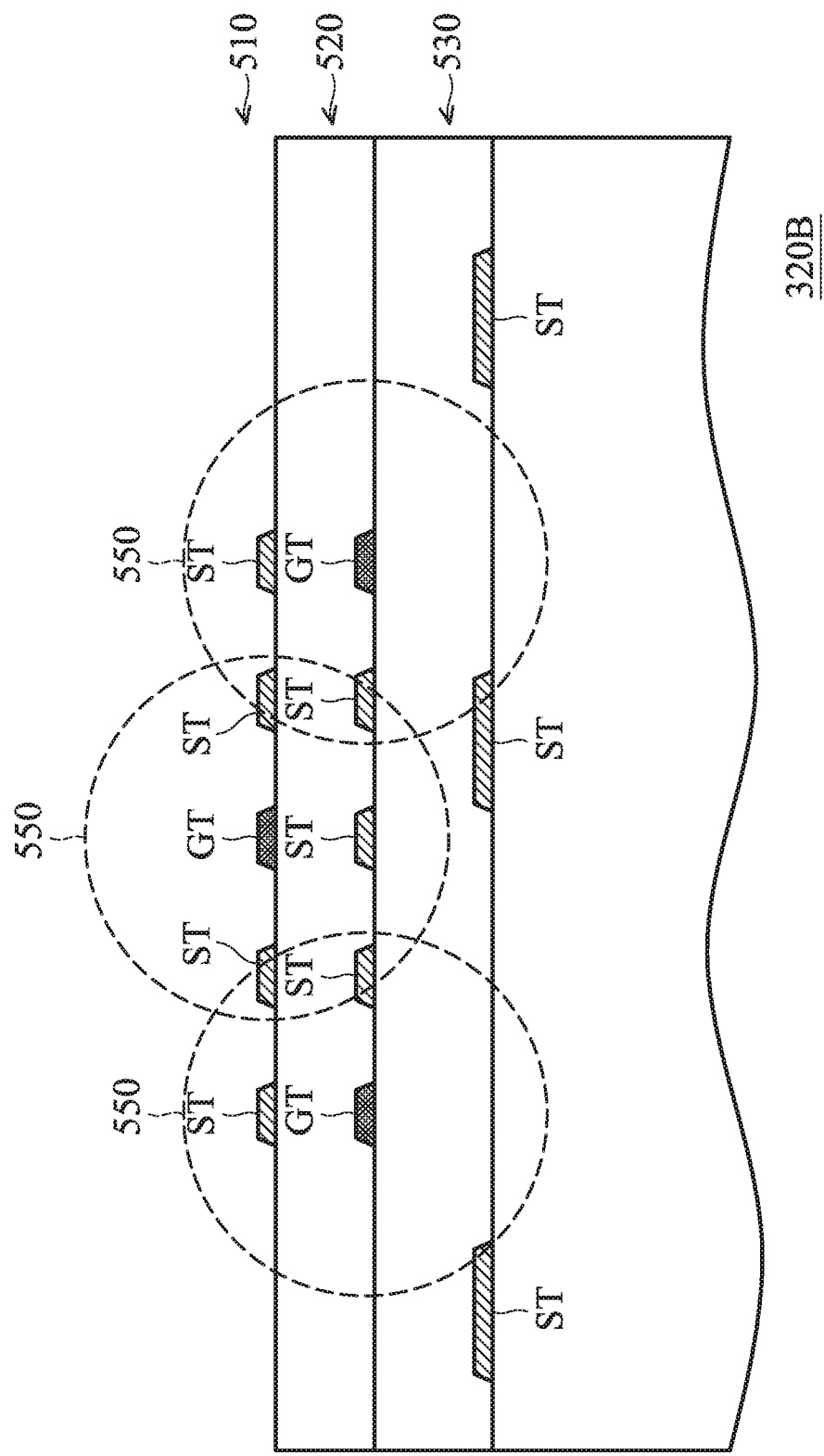
FIG. 5B shows a cross section illustrating the arrangement of the conductive traces of an exemplary PCB along line A-A' of FIG. 3 according to another embodiment of the invention.

FIG. 5B shows a cross section illustrating the arrangement of the conductive traces 340 of an exemplary PCB 320B along line A-A' of FIG. 3 according to another embodiment of the invention. Referring to FIG. 3 and FIG. 5B together, in the embodiment, the first chip 310 is operating in a high-speed mode. As described above, a portion of driving units of the first chip 310 are selected to provide the data $D_{out}$ in the high-speed mode, i.e. not all of the driving units of the first chip 310 are used to provide the data $D_{out}$. Furthermore, the unselected driving units are used to provide at least one shielding pattern. The specific shielding pattern is formed by a ground signal, a power signal or a random signal. In the embodiment, a middle conductive trace 340 in the first layer 510 of the PCB 320B functions as a guard trace GT, and other conductive traces 340 in the first layer 510 of the PCB 320B are the signal traces ST capable of transmitting the corresponding bit signals of the data $D_{out}$ to the second chip 330. Furthermore, two outermost conductive trace 340 in the second layer 520 of the PCB 320B functions as the guard traces GT, and other conductive traces 340 in the second layer 520 of the PCB 320B are the signal traces ST capable of transmitting the corresponding bit signals of the data $D_{out}$ to the second chip 330. Moreover, the conductive traces 340 in the third layer 530 of the PCB 320B are the signal traces ST capable of transmitting the corresponding bit signals of the data $D_{out}$ to the second chip 330. In the embodiment, each guard trace GT can provide a shielding range 550 for reducing interference when the data $D_{out}$ is transmitted via the signal traces ST adjacent to the guard trace GT, i.e. the guard trace GT is surrounded by the signal traces ST. Thus, crosstalk is decreased for the signal traces ST. It should be noted that the guard traces GT are separated by the signal traces ST in FIG. 5B. Furthermore, the shielding pattern transmitted by each guard trace GT can be the same or different. Compared with the traditional shielding lines, the guard traces GT of FIG. 5B will not occupy the additional area on the PCB 320B, i.e. the unused conductive traces will be used as the guard traces GT. Specifically, no additional shielding line is fixedly routed and inserted into the conductive traces 340 on the PCB 320B, thus decreasing layout size of the PCB 320B. Furthermore, the arrangement of the conductive traces 340 is determined according to the outputs of the driving units of the first chip 310 via the bumps 315, wherein the outputs of the driving units are controlled by a control circuitry of the first chip 310, e.g. the control circuitry 160 of FIG. 1. The control circuitry of the first chip 310 can modify the arrangement of the conductive traces 340 via the driving units according to actual applications. Furthermore, the guard traces GT can reduce electrical noise from affecting the signals on the PCB 320B. It should be noted that the arrangement of the conductive traces 340 in each layer of the PCB 320B can be swapped. For example, in one embodiment, two outermost conductive trace 340 in the second layer 510 of the PCB 320B could be the guard traces GT, and other conductive traces 340 in the second layer 510 of the PCB 320B could be the signal traces ST. Furthermore, a middle conductive trace 340 in the first layer 520 of the PCB 320B could be a guard trace GT, and other conductive traces 340 in the first layer 520 of the PCB 320B could be the signal traces ST. Furthermore, the number of guard traces GT is less than the number of signal traces ST in FIG. 5B.

Figure 5C:
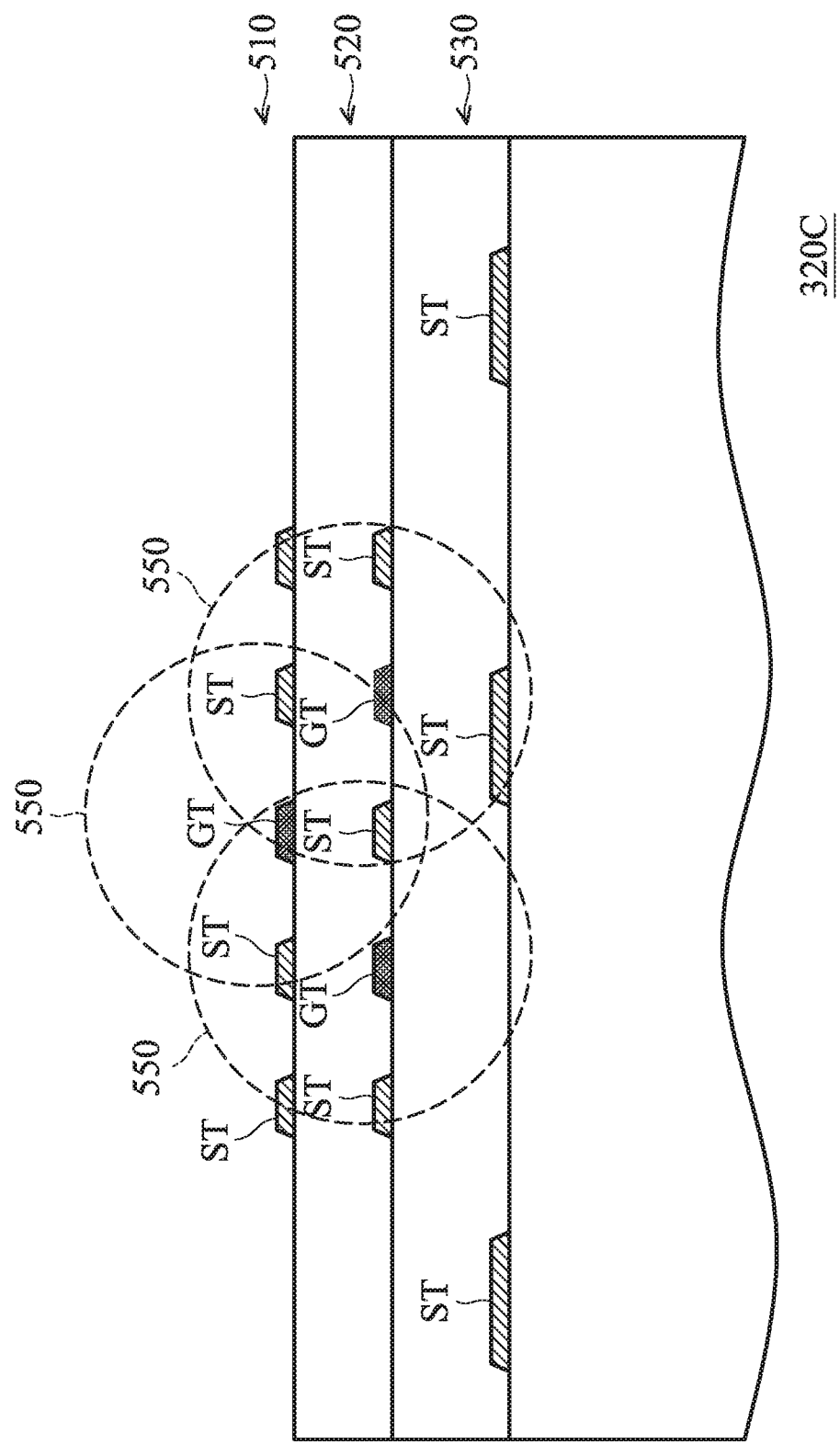
FIG. 5C shows a cross section illustrating the arrangement of the conductive traces of an exemplary PCB along line A-A' of FIG. 3 according to another embodiment of the invention.

FIG. 5C shows a cross section illustrating the arrangement of the conductive traces 340 of an exemplary PCB 320C along line A-A' of FIG. 3 according to another embodiment of the invention. Referring to FIG. 3 and FIG. 5C together, in the embodiment, the first chip 310 of FIG. 3 is operating in a high-speed mode. Compared with the embodiment of FIG. 5B, the arrangement of the conductive traces 340 in the second layer 520 on the PCB 320B in FIG. 5B is different from the arrangement of the conductive traces 340 in the second layer 520 on the PCB 320C in FIG. 5C. In FIG. 5C, a middle conductive trace 340 and the two outermost conductive trace 340 in the second layer 520 of the PCB 320B are the signal traces ST capable of transmitting the corresponding bit signals of the data $D_{out}$ to the second chip 330, and other conductive traces 340 in the second layer 520 of the PCB 320B functions as the guard traces GT. In the embodiment, each guard trace GT can provide a shielding range 550 for reducing interference when the data $D_{out}$ is transmitted via the signal traces ST adjacent to the guard trace GT, i.e. the guard trace GT is surrounded by the signal traces ST. As described above, the guard traces GT are separated by the signal traces ST. Furthermore, the shielding pattern transmitted by each guard trace GT can be the same or different. It should be noted that the arrangement of the conductive traces 340 in each layer of the PCB 320C also can be swapped. Furthermore, the number of guard traces GT is less than the number of signal traces ST in FIG. 5C.

Figure 6:
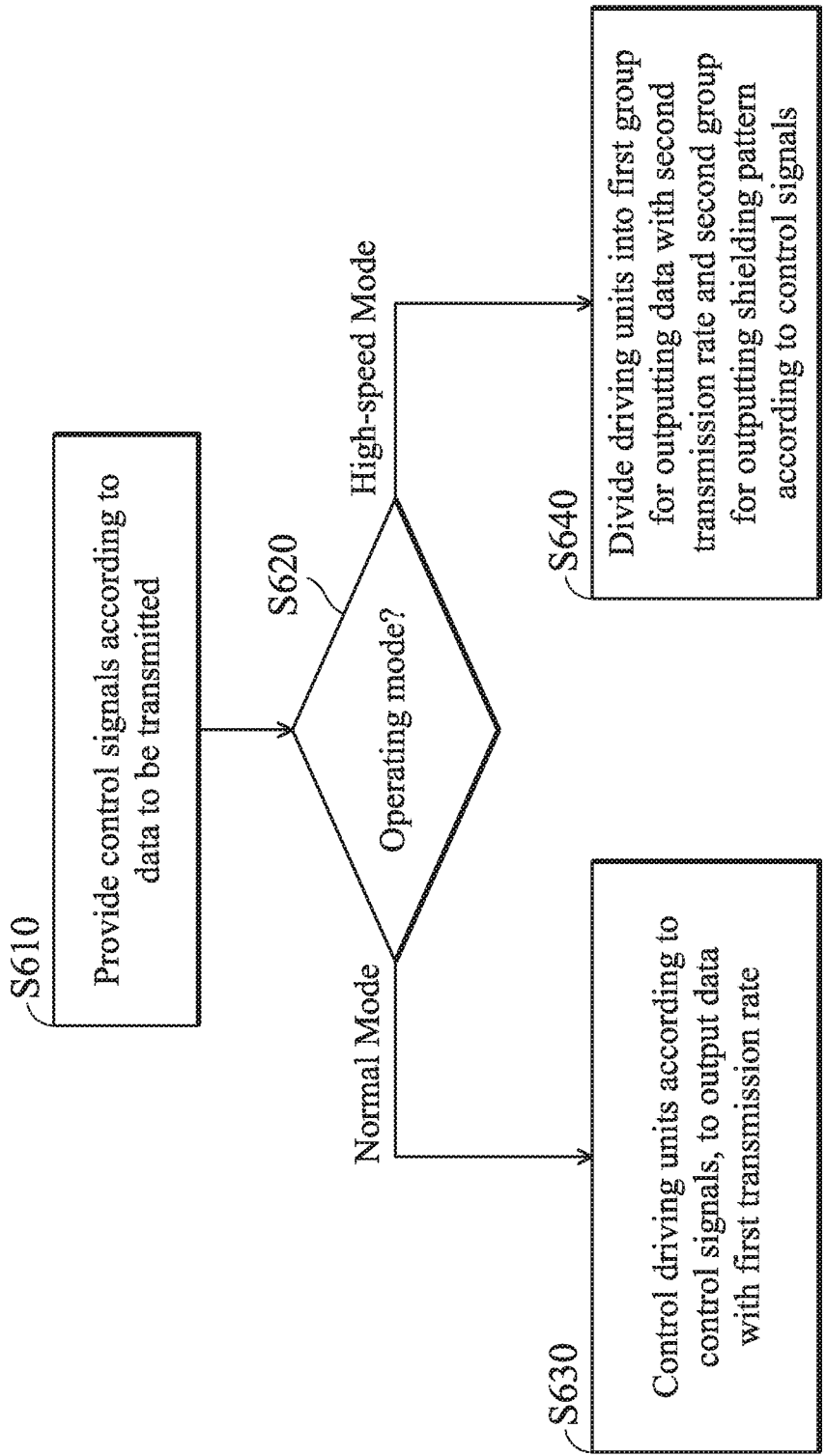
FIG. 6 shows a method for transmitting data from a first chip to a second chip via a plurality of conductive traces of a printed circuit board in an electronic device.

FIG. 6 shows a method for transmitting data from a first chip to a second chip via a plurality of conductive traces of a printed circuit board in an electronic device (e.g. 100 of FIG. 1 or 300 or FIG. 3). In the electronic device, the first chip and the second chip are mounted on the PCB. First, a control circuitry of the first chip provides a plurality of control signals according to the data to be transmitted to the second chip (step S610). Next, it is determined which mode that first chip is operating (step S620). If the first chip is operating in a normal mode, a plurality of driving units of the first chip are controlled according to the control signals, to output the data via the conductive traces of the PCB according to a first transmission rate (step S630). If the first chip is operating in a high-speed mode, the driving units of the first chip are divided into two groups according to the control signals (step S640), wherein a first group of driving units are used to output the data via the signal traces ST of the PCB according to a first transmission rate, and a second group of driving units are used to output at least one specific shielding pattern via the guard traces GT of the PCB according to a second transmission rate. The second transmission rate is higher than the first transmission rate. The specific shielding pattern is formed by a ground signal, a power signal or a random signal. In one embodiment, each guard trace GT is surrounded by the signal traces ST on the PCB. Furthermore, the guard traces GT are separated by the signal traces ST.

According to the embodiments, a control circuitry of a first chip can control the arrangement of the conductive traces between the first chip and a second chip via the driving units of the first chip to transmit the data $D_{out}$ to the second chip. In a normal mode, the conductive traces are used to provide the data $D_{out}$ to the second chip. In a high-speed mode, a portion of driving units is selected to provide the data $D_{out}$ and the remaining driving units are used to provide at least one specific shielding pattern, wherein the specific shielding pattern is formed by a ground signal, a power signal or a random signal. Furthermore, the conductive traces coupled to the selected driving units function as the signal traces ST on the PCB, and the conductive traces coupled to the remainder of the driving units function as the guard traces GT on the PCB. According to the embodiments, no shielding line is fixedly routed and inserted into the conductive traces between the first chip and the second chip on the PCB.

Furthermore, in one embodiment, no matter whether the normal mode or high-speed mode is being used, the unused conductive traces can be used as the guard traces GT so as to provide a shielding range for the adjacent signal traces ST. Therefore, no additional shielding line is fixedly routed and inserted into the signal traces ST on the PCB, thus decreasing layout size of the PCB. Moreover, the arrangement of the conductive traces is determined according to the outputs of the driving units of the first chip via the bumps or pins thereof, wherein the outputs of the driving units are controlled by the control circuitry of the first chip. The control circuitry of the first chip can modify the arrangement of the conductive traces via the driving units according to actual applications, thereby increasing design flexibility.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit, comprising:
 a control circuitry, providing a plurality of control signals according to data to be transmitted from the integrated circuit to a device;
 a plurality of pins, wherein the pins are coupled to the device via a plurality of conductive traces of a printed circuit board (PCB); and
 a plurality of driving units coupled to the pins, wherein the control signals control each of the driving units to selectively provide the data or a shielding pattern to the device via the corresponding pin and the corresponding conductive trace of PCB, wherein in a normal mode, the control signals control the driving units to output the data via the corresponding pins according to a first transmission rate, and each of the conductive traces of the PCB is a signal trace, and wherein in a high-speed mode, the control signals control a portion of the driving units to output the data via the pins corresponding to the portion of the driving units according to a second transmission rate that is higher than the first transmission rate, and the control signals control an other portion of the driving units to output the shielding pattern via the pins corresponding to the other portion of the driving units.

2. The integrated circuit as claimed in claim 1, wherein in the high-speed mode, each of the conductive traces of the PCB coupled to the pins corresponding to the portion of the driving units is a signal trace, and each of the conductive traces of the PCB coupled to the pins corresponding to the other portion of the driving units is a guard trace.

3. The integrated circuit as claimed in claim 2, wherein the guard traces are separated by the signal traces.

4. The integrated circuit as claimed in claim 2, wherein each of the guard traces is surrounded by the signal traces.

5. The integrated circuit as claimed in claim 1, wherein the second transmission rate is twice the first transmission rate.

6. The integrated circuit as claimed in claim 1, wherein the shielding pattern is formed by a ground signal, a power signal or a random signal.

7. The integrated circuit as claimed in claim 1, wherein the number of pins corresponding to the other portion of the driving units is less than the number of pins corresponding to the portion of the driving units.

8. An electronic device, comprising:
   a printed circuit board (PCB), comprising a plurality of conductive traces;
   a first chip mounted on the PCB; and
   a second chip mounted on the PCB;
   wherein the first chip comprises:
      a plurality of pins coupled to the second chip via the conductive traces of the PCB;
      a control circuitry, providing a plurality of control signals according to data to be transmitted from the first chip to the second chip; and
      a plurality of driving units coupled to the pins, wherein the control signals control each of the driving units to selectively provide the data or a shielding pattern to the second chip via the corresponding pin and the corresponding conductive trace of PCB,
      wherein in a normal mode, the control signals control the driving units to provide the data to the second chip via the corresponding pins according to a first transmission rate, and each of the conductive traces of the PCB is a signal trace, and
      wherein in a high-speed mode, the control signals control a portion of the driving units to provide the data to the second chip via the pins corresponding to the portion of the driving units according to a second transmission rate that is higher than the first transmission rate, and the control signals control an other portion of the driving units to provide the shielding pattern via the pins corresponding to the other portion of the driving units.

9. The electronic device as claimed in claim 8, wherein in the high-speed mode, each of the conductive traces corresponding to the portion of the driving units is a signal trace and each of the conductive traces corresponding to the other portion of the driving units is a guard trace, and the guard traces are separated by the signal traces on the PCB.

10. The electronic device as claimed in claim 9, wherein each of the guard traces is surrounded by the signal traces.

11. The electronic device as claimed in claim 8, wherein the second transmission rate is twice the first transmission rate.

12. The electronic device as claimed in claim 8, wherein the shielding pattern is formed by a ground signal, a power signal or a random signal.

13. The electronic device as claimed in claim 9, wherein the number of guard traces is less than the number of signal traces in the high-speed mode.

14. The electronic device as claimed in claim 8, wherein each of the driving units comprises:
   a PMOS transistor coupled between a power supply and the corresponding pin; and
   an NMOS transistor coupled between the corresponding pin and a ground.

15. The electronic device as claimed in claim 9, wherein in the high-speed mode, the control signals control the portion of the driving units to provide the data to the second chip via the signal traces according to the second transmission rate, and the control signals control the other portion of the driving units to provide the shielding pattern to the second chip via the guard traces.

16. The electronic device as claimed in claim 8, wherein no shielding line is fixedly routed and inserted into the conductive traces on the PCB.

17. A method for transmitting data from a first chip to a second chip via a plurality of conductive traces of a printed circuit board (PCB) in an electronic device, wherein the first chip and the second chip are mounted on the PCB, comprising:
   providing a plurality of control signals according to the data to be transmitted to the second chip, by the first chip;
   controlling a plurality of driving units to selectively provide the data or at least one specific shielding pattern to the second chip via the corresponding conductive trace of the PCB, by the first chip;
   in a normal mode, in response to the control signals, controlling each of the driving units of the first chip to output the data via the conductive traces of the PCB according to a first transmission rate; and
   in a high-speed mode:
      dividing the driving units of the first chip into a plurality of first driving units and a plurality of second driving units according to the control signals;
      controlling the first driving units to output the data via a plurality of signal traces among the conductive traces of the PCB according to a second transmission rate, wherein the second transmission rate is higher than the first transmission rate; and
      controlling the second driving units to output the at least one shielding pattern via a plurality of guard traces among the conductive traces of the PCB, wherein each of the guard traces is surrounded by the signal traces on the PCB.

18. The method as claimed in claim 17, wherein the guard traces are separated by the signal traces on the PCB.

19. The method as claimed in claim 17, wherein the at least one shielding pattern is formed by a ground signal, a power signal or a random signal.

20. The method as claimed in claim 17, wherein the number of guard traces is less than the number of signal traces in the high-speed mode.

21. The method as claimed in claim 17, wherein no shielding line is fixedly routed and inserted into the conductive traces on the PCB.

22. An integrated circuit (IC), comprising:
- control circuitry configured to provide a plurality of control signals based on data to be transmitted from the IC to a second IC; and
- a plurality of driving units configured to provide, based on the control signals, the data to the second IC via a plurality of conductive traces of a substrate,
- wherein in a first mode, the plurality of driving units are configured to provide the data to the second IC via the plurality of conductive traces of the substrate, and
- wherein in a second mode, (i) a first subset of the plurality of driving units is configured to provide the data to the second IC via a corresponding first subset of the plurality of conductive traces of the substrate, and (ii) a second subset of the plurality of driving units is configured to provide at least one shielding voltage to a corresponding second subset of the plurality of conductive traces of the substrate.

23. The IC of claim 22, wherein in the first mode, the plurality of driving units provide the data at a first transmission rate, and each of the plurality of conductive traces is a signal trace.

24. The IC of claim 23, wherein in the second mode, the first subset of the driving units provide the data at a second transmission rate that is higher than the first transmission rate.

25. The IC of claim 22, wherein in the second mode, each of the first subset of the conductive traces corresponding to the first subset of the driving units is a signal trace, and each of the second subset of the conductive traces corresponding to the second subset of the driving units is a guard trace.

26. An electronic device, comprising:
- a first chip; and
- a second chip,
- wherein the first chip comprises:
    - control circuitry configured to provide a plurality of control signals based on data to be transmitted from the first chip to the second chip; and
    - a plurality of driving units configured to provide, based on the control signals, the data to the second chip via a plurality of conductive traces of a substrate,
    - wherein in a first mode, the plurality of driving units are configured to provide the data to the second chip via the plurality of conductive traces of the substrate, and
    - wherein in a second mode, (i) a first subset of the plurality of driving units is configured to provide the data to the second chip via a corresponding first subset of the plurality of conductive traces of the substrate, and (ii) a second subset of the plurality of driving units is configured to provide at least one shielding voltage via a corresponding second subset of the plurality of conductive traces of the substrate.

* * * * *

UNITED STATES PATENT AND TRADEMARK OFFICE
CERTIFICATE OF CORRECTION

PATENT NO. : 9,978,692 B2
APPLICATION NO. : 14/997048
DATED : May 22, 2018
INVENTOR(S) : PoHao Chang et al.

It is certified that error appears in the above-identified patent and that said Letters Patent is hereby corrected as shown below:

In Claim 17, at Column 10, Line 39, delete "at least one specific shielding" and replace it with -- at least one shielding --

Signed and Sealed this
Fourth Day of December, 2018

Andrei Iancu
*Director of the United States Patent and Trademark Office*